(12) United States Patent
Hatori et al.

(10) Patent No.: US 8,304,757 B2
(45) Date of Patent: Nov. 6, 2012

(54) SEMICONDUCTOR LIGHT-EMITTING DEVICE, OPTICAL MODULE, TRANSMITTER, AND OPTICAL COMMUNICATION SYSTEM

(75) Inventors: Nobuaki Hatori, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 99 days.

(21) Appl. No.: 12/877,624

(22) Filed: Sep. 8, 2010

(65) Prior Publication Data

US 2011/0006282 A1 Jan. 13, 2011

Related U.S. Application Data

(63) Continuation of application No. PCT/JP2008/055144, filed on Mar. 19, 2008.

(51) Int. Cl.
H01L 29/06 (2006.01)
H01L 27/15 (2006.01)
H01L 29/732 (2006.01)
H01L 21/00 (2006.01)

(52) U.S. Cl. ....... 257/13; 257/79; 257/183; 257/E29.07; 257/E29.071; 438/46; 438/47

(58) Field of Classification Search .................... 438/46, 438/47, 37; 257/13, 14, 79, 90, 94, 183, 257/E29.07, E29.071
See application file for complete search history.

(56) References Cited

U.S. PATENT DOCUMENTS

| 6,166,320 | A * | 12/2000 | Nagashima et al. .......... 136/249 |
| 7,015,498 | B2 | 3/2006 | Ebe et al. |
| 7,160,822 | B2 | 1/2007 | Jones et al. |
| 7,573,060 | B2 * | 8/2009 | Hatori et al. .................... 257/21 |
| 2004/0124409 | A1 | 7/2004 | Ebe et al. |
| 2004/0217343 | A1 * | 11/2004 | Chang et al. .................... 257/25 |
| 2005/0227386 | A1 | 10/2005 | Jones et al. |
| 2006/0185582 | A1 * | 8/2006 | Atwater et al. ................. 117/89 |

(Continued)

FOREIGN PATENT DOCUMENTS

JP 2000-022278 A 1/2000

(Continued)

OTHER PUBLICATIONS

Hashimoto, R. et al "Room-temperature Continuous Wave Operation of 1.3 μm InAs Quantum Dot Lasers with GaInNAs Embedded Layer on GaAs Substrate Grown by MOCVD," IEICE Technical Report, Jun. 29, 2007, pp. 23-28, vol. 107, No. 124, The Institute of Electronics, Information and Communication engineers. w/ English Abstract.

International Search Report of PCT/JP2008/055114, mailing date Apr. 22, 2008.

Primary Examiner — Hsien Ming Lee

(74) Attorney, Agent, or Firm — Westerman, Hattori, Daniels & Adrian, LLP

(57) ABSTRACT

A semiconductor light-emitting device includes a GaAs substrate; and an active layer provided over the GaAs substrate, the active layer including: a lower barrier layer lattice-matched to the GaAs substrate; a quantum dot provided on the lower barrier layer; a strain relaxation layer covering a side of the quantum dot; and an upper barrier layer contacting the top of the quantum dot, at least a portion of the upper barrier layer contacting the top of the quantum dot being lattice-matched to the GaAs substrate, and having a band gap larger than a band gap of the quantum dot and smaller than a band gap of GaAs.

20 Claims, 10 Drawing Sheets

U.S. PATENT DOCUMENTS

| | | | |
|---|---|---|---|
| 2007/0151595 A1* | 7/2007 | Chiou et al. | 136/255 |
| 2008/0024849 A1* | 1/2008 | Hayashi et al. | 359/204 |
| 2008/0042122 A1 | 2/2008 | Hatori et al. | |
| 2008/0073716 A1* | 3/2008 | Yamamoto et al. | 257/347 |
| 2008/0157059 A1* | 7/2008 | Hatori et al. | 257/15 |
| 2009/0263926 A1* | 10/2009 | Hatori et al. | 438/45 |

FOREIGN PATENT DOCUMENTS

| | | |
|---|---|---|
| JP | 2000-196065 A | 7/2000 |
| JP | 2004-111710 A | 4/2004 |
| JP | 2005-534164 A | 11/2005 |
| JP | 2008-047684 A | 2/2008 |

* cited by examiner

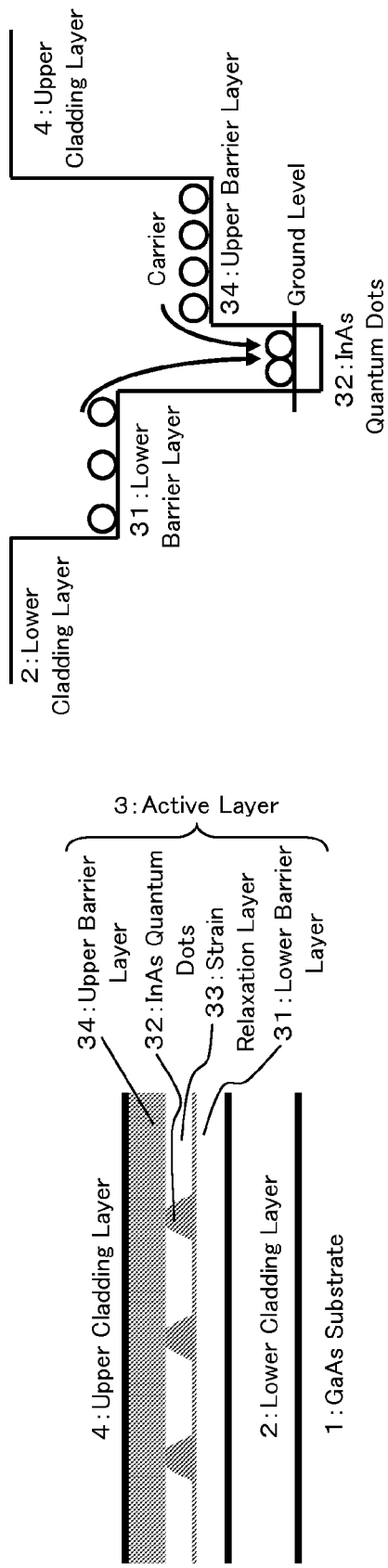

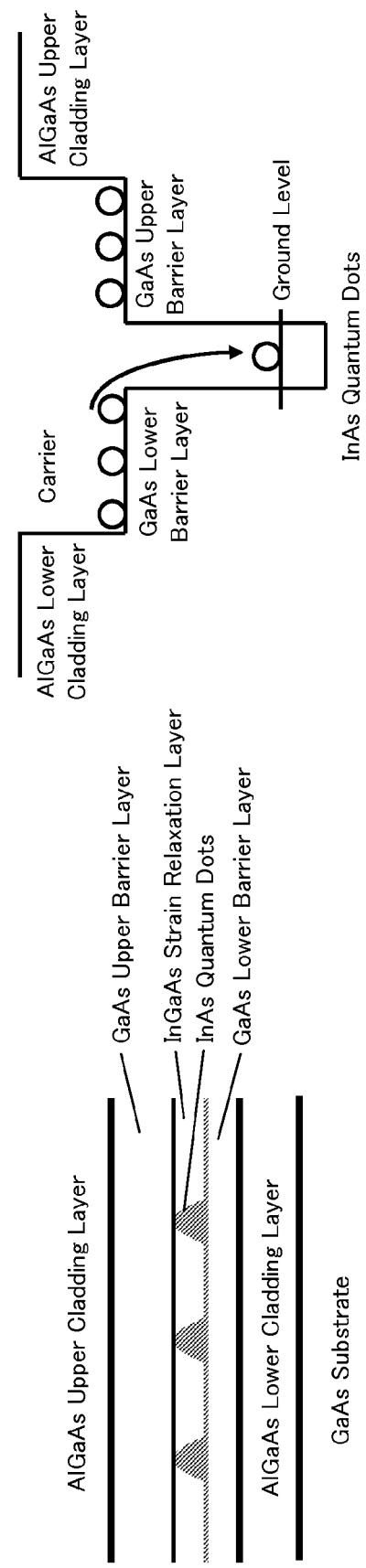

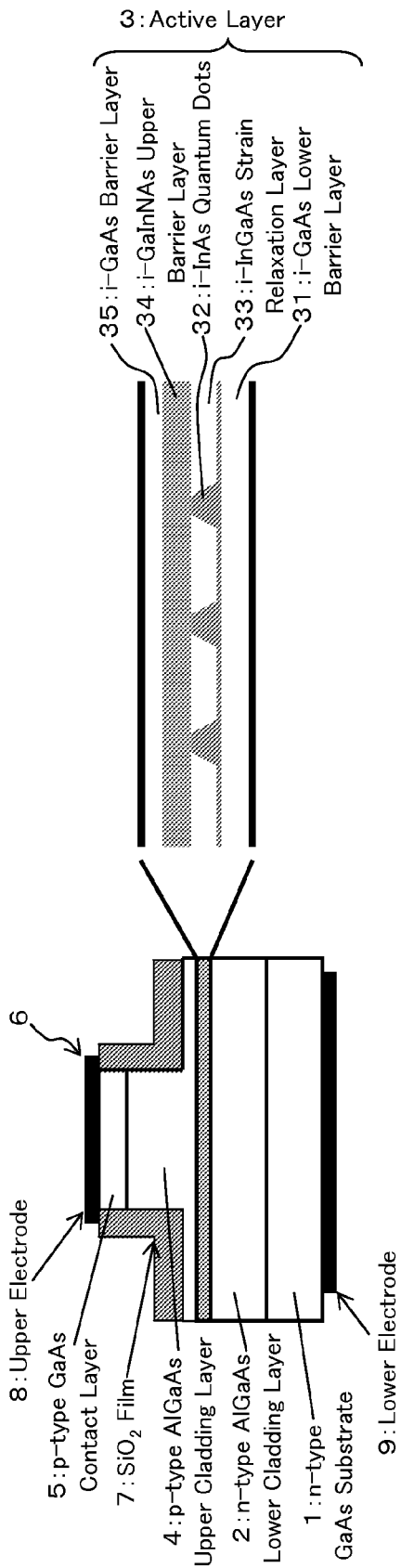
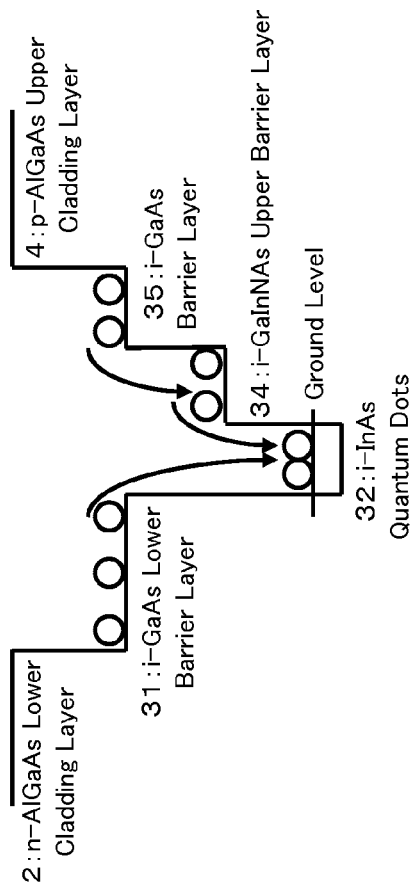
FIG. 3A
FIG. 3B

SEMICONDUCTOR LIGHT-EMITTING DEVICE, OPTICAL MODULE, TRANSMITTER, AND OPTICAL COMMUNICATION SYSTEM

CROSS REFERENCE TO RELATED APPLICATIONS

This application is a continuation Application of a PCT international application No. PCT/JP2008/055114 filed on Mar. 19, 2008 in Japan, the entire contents of which are incorporated by reference.

FIELD

The embodiments discussed herein are related to a semiconductor light-emitting device having a quantum dot used for an active layer and a method for manufacturing the same, an optical module, a transmitter, and an optical communication system.

BACKGROUND

One technique related to a semiconductor light-emitting device having a quantum dot used in an active layer involves forming an InAs quantum dot above a GaAs substrate, and covering the entire surfaces of the InAs quantum dot with an InGaAs layer, followed by deposition of a GaAs layer, for example (first structure).

Another technique involves forming a spacer layer (e.g., made from GaAs) including a strain region above a substrate (e.g., GaAs substrate), forming a quantum dot (e.g., InAs quantum dot) on the strain region of the spacer layer, and covering the entire surface of the quantum dot with a capping layer (e.g., made from GaAs or GaInNAs) (second structure).

SUMMARY

According to an aspect of the embodiment, a semiconductor light-emitting device, an optical module, a transmitter, and an optical communication system includes a GaAs substrate; and an active layer provided over the GaAs substrate, the active layer including: a lower barrier layer lattice-matched to the GaAs substrate; a quantum dot provided on the lower barrier layer; a strain relaxation layer covering a side of the quantum dot; and an upper barrier layer contacting the top of the quantum dot, at least a portion of the upper barrier layer contacting the top of the quantum dot being lattice-matched to the GaAs substrate or having a lattice constant smaller than a lattice constant of the GaAs substrate, and having a band gap larger than a band gap of the quantum dot and smaller than a band gap of GaAs.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

FIG. 1A is a schematic cross-sectional view illustrating a semiconductor light-emitting device according to a first embodiment;

FIG. 1B is an energy band diagram of the semiconductor light-emitting device shown in FIG. 1A;

FIGS. 2A and 2B are diagrams illustrating issues to be addressed by the present invention;

FIG. 3A is a schematic cross-sectional view illustrating an exemplary configuration of a semiconductor light-emitting device according to a first embodiment;

FIG. 3B is an energy band diagram of the exemplary configuration of the semiconductor light-emitting device shown in FIG. 3A;

DESCRIPTION OF EMBODIMENTS

Figure 4:
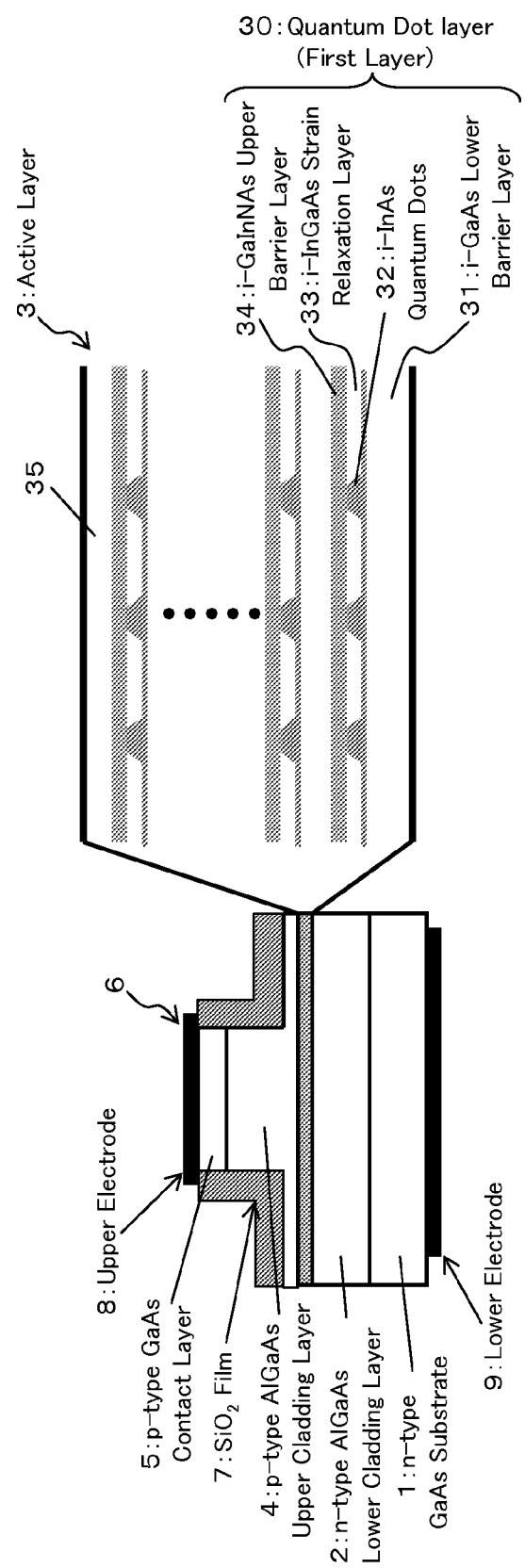
FIG. 4 is a schematic cross-sectional view illustrating an exemplary configuration of a semiconductor light-emitting device according to a second embodiment.

In the first structure described above, the InGaAs layer covering the entire surfaces of the InAs quantum dot exhibits a compression strain, like the InAs quantum dot. Stacking multiple quantum dots involves stacking quantum dots having a compression strain above the InGaAs layer having a compression strain. The greater the number of layers in the stack becomes, the greater the accumulated strain becomes, which may makes stacking a desired number of layers difficult. The strain of quantum dots cannot be relaxed by increasing the thickness of the InGaAs layer, since the InGaAs layer exhibits a compression strain.

In the second structure described above, the spacer layer having the strain region is formed by forming the spacer layer covering the quantum dot having a strain, and the quantum dot in the active layer are formed on the strain region of the spacer layer. In other words, in the second structure, the upper quantum dot is formed by proactively utilizing the strain of the lower quantum dot such that the strain of the lower quantum dot is maintained. In such a structure wherein the strain of quantum dots is maintained, stacking a desired number of layers may become difficult.

When the aforementioned second structure is formed by forming a GaAs spacer layer on a GaAs substrate, forming an InAs quantum dot on the GaAs spacer layer, followed by covering the entire surfaces of the InAs quantum dot with a GaAs capping layer, the carrier injection efficiency into the quantum dot is not satisfactory since the band gap difference between the InAs quantum dot and the GaAs capping layer is great.

Enhancing the carrier injection efficiency into a quantum dot, as well as improving the quality of the quantum dot by relaxing the strain of the quantum dot, thereby facilitating stack of multiple quantum dot layers are needed.

Hereinafter, a semiconductor light-emitting device and a method for manufacturing the same, an optical module, a transmitter, and an optical communication system according to embodiments will be described with reference to the drawings.

[First Embodiment]

A semiconductor light-emitting device and a method for manufacturing the same according to a first embodiment will be described with reference to FIGS. 1A-3A and 3B.

A semiconductor light-emitting device according to this embodiment is, for example, a quantum dot semiconductor light-emitting device (semiconductor laser; for example, 1.3 µm wavelength band quantum dot laser) operating as a light source for optical fiber communications. It includes a lower cladding layer 2, an active layer (quantum dot active layer) 3, and an upper cladding layer 4, above a GaAs substrate 1, as depicted in FIG. 1A.

As depicted in FIG. 1A, the active layer 3 includes a lower barrier layer 31 lattice-matched to the GaAs substrate 1, an InAs quantum dot 32 (Here, a plurality of InAs quantum dots) formed on the lower barrier layer 31, a strain relaxation layer 33 covering the side of the InAs quantum dot 32, and an upper barrier layer 34 contacting the top of the InAs quantum dot 32.

It has been found that, in a 1.3 µm wavelength band InAs quantum dot laser having a structure wherein an AlGaAs lower cladding layer, a GaAs lower barrier layer, an InAs quantum dot, an InGaAs strain relaxation layer, a GaAs upper barrier layer, and an AlGaAs upper cladding layer are formed above a GaAs substrate, as depicted in FIG. 2A, the difference in the band gaps between the InAs quantum dot and the GaAs upper/lower barrier layer is great as depicted in FIG. 2B, resulting in lowering the carrier injection efficiency into the InAs quantum dot.

For example, in a 1.3 µm wavelength band quantum well laser formed on an InP substrate, the band gap difference between the well layer and the barrier layer is about 200 meV. In contrast, in a 1.3 µm wavelength band InAs quantum dot laser formed on a GaAs substrate, the band gap difference between an InAs quantum dot emitting light at the 1.3 µm wavelength band (having a band gap of about 0.954 eV) and a GaAs upper/lower barrier layer (having a band gap of about 1.424 eV) is as great as 470 meV. For this reason, it has been found that carriers are trapped in the InAs quantum dot and oftentimes cannot reach to the ground state due to this higher energy barrier with respect to the InAs quantum dot, thereby resulting in the carrier injection efficiency into the InAs quantum dot.

This issue can be addressed by forming the upper barrier layer 34 from a semiconductor material having a band gap larger than the band gap of the InAs quantum dot 32 and smaller than the band gap of GaAs, as depicted in FIG. 1B. This can help to lower the energy barrier with respect to the InAs quantum dot 32, thereby improving the carrier injection efficiency into the InAs quantum dot 32.

In this embodiment, the upper barrier layer 34 is formed from a semiconductor material having a band gap smaller than the band gap of the lower barrier layer 31.

More specifically, when the lower barrier layer 31 is a GaAs lower barrier layer, a GaInNAs upper barrier layer can be used for the upper barrier layer 34. In this structure, since the band gap of the GaInNAs upper barrier layer 34 becomes smaller than the band gap of the GaAs lower barrier layer 31, thereby lowering the energy barrier with respect to the InAs quantum dot 32, carriers existing in the GaInNAs upper barrier layer 34 are more easily injected into the InAs quantum dot 32, resulting in improved injection efficiency. In other words, since the band gap of one of the upper and lower barrier layers (more specifically, the upper barrier layer 34) is reduced, as compared to the case in which GaAs barrier layers are used for both the upper and lower barrier layers (see FIG. 2B), the energy barrier with respect to the InAs quantum dot 32 lowers, thereby improving the carrier injection efficiency into the InAs quantum dot 32.

A 1.3 µm wavelength band quantum dot laser of this embodiment includes a semiconductor stack structure having an n-type AlGaAs lower cladding layer 2, an active layer 3 having an i-InAs quantum dot 32, a p-type AlGaAs upper cladding layer 4, a p-type GaAs contact layer 5, staked above an n-type GaAs substrate (n-type conductive substrate) 1, as depicted in FIG. 3A.

Additionally, a ridge structure (ridge waveguide structure) 6 is also provided, which is formed by removing the p-type AlGaAs upper cladding layer 4 to some midpoint thereof, as depicted in FIG. 3A. The sides of the ridge structure 6 and the surfaces of the p-type AlGaAs upper cladding layer 4 exposed on opposite sides of the ridge structure 6 are covered with an $SiO_2$ passivation film 7, and an upper electrode (p-side electrode) 8 and a lower electrode (n-side electrode) 9 are provided on the p-type GaAs contact layer 5 and the backside of the n-type GaAs substrate 1, respectively. Finally, highly reflective films (not illustrated) are provided on facets of the device. Such a structure is referred to as a "Fabry-Pérot laser."

Particularly, in this embodiment, the active layer 3 includes an i-GaAs lower barrier layer 31, an i-InAs self-assembled quantum dot (including a wetting layer) 32, an i-InGaAs strain relaxation layer 33 (e.g., an $In_{0.2}Ga_{0.8}As$ strain relaxation layer), an i-GaInNAs upper barrier layer 34, and an i-GaAs barrier layer 35, as depicted in FIG. 3A.

In this case, the GaAs lower barrier layer 31 is formed on the AlGaAs lower cladding layer 2, as depicted in FIG. 3A.

The InAs quantum dot 32 is self-assembled on the GaAs lower barrier layer 31 lattice-matched to the GaAs substrate 1, as depicted in FIG. 3A.

The InGaAs strain relaxation layer 33 contacts the side of the InAs quantum dot 32 and relaxes the strain of the InAs quantum dot 32, as depicted in FIG. 3A, and has a lattice constant larger than that of the GaAs substrate 1 and has a compression strain. The InGaAs strain relaxation layer 33 has a thickness that is comparative to the height of the InAs quantum dot 32, so that the side wall of the InAs quantum dot 32 is covered. Note that the InGaAs strain relaxation layer 33 functions to adjust the band gap of the quantum dot 32 so that a desired emission wavelength is achieved.

On the InAs quantum dot 32 and the InGaAs strain relaxation layer 33, the GaInNAs upper barrier layer 34 is formed, as depicted in FIG. 3A. This can lower the energy barrier with respect to the InAs quantum dot 32, as depicted in FIG. 3B.

In this embodiment, GaInNAs lattice-matched to the GaAs substrate 1 is used in the upper barrier layer 34. In this embodiment, a GaAs barrier layer 35 is further provided on the GaInNAs upper barrier layer 34. The total thickness of the GaInNAs upper barrier layer 34 and the GaAs barrier layer 35 are designed to be capable of relaxing the strain in the barrier layers 34 and 35 generated by the strain of the quantum dot 32. This can help to improve the qualities of the quantum dot 32.

In this embodiment, a p-type AlGaAs upper cladding layer 4 is formed on the GaAs upper barrier layer 35.

Now, a method for manufacturing a semiconductor light emitting device according to this embodiment will be described with reference to FIGS. 3A and 3B.

This method for manufacturing a semiconductor light-emitting device involves forming a lower cladding layer 2 on a GaAs substrate 1; forming a lower barrier layer 31 on the lower cladding layer 2; forming a quantum dot 32 on the lower barrier layer 31; forming a strain relaxation layer 33 having a thickness comparable to the height of the quantum dot 32 so as to cover the side of the quantum dot 32; forming an upper barrier layer 34 on the quantum dot 32 and the strain relaxation layer 33, the upper barrier layer 34 being lattice-matched to the GaAs substrate 1 and having the band gap larger than the band gap of the quantum dot 32 and smaller than the band gap of GaAs; and forming an upper cladding layer 4 on the upper barrier layer 34 (see FIGS. 3A and 3B).

In this embodiment, forming the upper barrier layer 34 involves forming the upper barrier layer 34 having the band gap smaller than the band gap of the lower barrier layer 31.

Hereinafter, this method for manufacturing a semiconductor light-emitting device will be described in more detail.

For the growth of the respective semiconductor layers, molecular beam epitaxy (MBE) is employed.

An n-AlGaAs lower cladding layer 2 (e.g., with a thickness of about 1.4 μm) and an i-GaAs lower barrier layer 31 (e.g., with a thickness of about 100 nm) are formed above an n-GaAs substrate (n-GaAs (001) substrate; n-type conductive substrate) 1 (see FIG. 3A).

Subsequently, an InAs quantum dot 32 (e.g., with an area density of about $4 \times 10^{10}$ cm$^{-2}$) are formed on the i-GaAs lower barrier layer 31 with a self-assembly technique, followed by formation of an i-InGaAs strain relaxation layer 33 (e.g., an $In_{0.2}Ga_{0.8}As$ strain relaxation layer) so as to cover the side of the InAs quantum dot 32 (see FIG. 3A). The i-InGaAs strain relaxation layer 33 is formed to a thickness smaller than the height of the quantum dot 32.

Thereafter, the temperature in the growth chamber is raised, and the topmost portion of the InAs quantum dot 32 is reevaporated by flashing technique, so that the InAs quantum dot 32 has a height comparable to the thickness of the i-InGaAs strain relaxation layer 33. This helps to reduce the variation of the sizes (heights) of the InAs quantum dot 32, accordingly the InAs quantum dot 32 that has a uniform size are formed (see FIG. 3A).

Here, the top of the InAs quantum dot 32 with a GaInNAs upper barrier layer 34 is covered, after covering the side of the InAs quantum dot 32 with the InGaAs strain relaxation layer 33, as will be described later, for preventing the quality of the InAs quantum dot 32 from being deteriorated. More specifically, the quality of the InAs quantum dot 32 will be degraded if the side of the InAs quantum dot 32 would be covered with material containing a nitrogen (N) since nitrogen would be trapped in the InAs quantum dot 32. For this reason, in order to suppress the effects of nitrogen on the InAs quantum dot 32 to maintain the quality of the InAs quantum dot 32, after covering the side of the InAs quantum dot 32 with the InGaAs strain relaxation layer 33, the top of the InAs quantum dot 32 is covered with the GaInNAs upper barrier layer 34, as will be described later.

Thereafter, the temperature in the growth chamber is lowered, a GaInNAs upper barrier layer 34 (e.g., with a thickness of about 10 nm) is formed overlaying the InAs quantum dot 32 and the InGaAs strain relaxation layer 33, and a GaAs barrier layer 35 (e.g., with a thickness of about 90 nm) is formed on the GaInNAs upper barrier layer 34 (see FIG. 3A).

In this manner, the active layer (quantum dot active layer) 3 is provided, having the GaAs lower barrier layer 31, the InAs quantum dot 32, the InGaAs strain relaxation layer 33, the GaInNAs upper barrier layer 34, and the GaAs barrier layer 35 formed above the AlGaAs lower cladding layer 2 (see FIG. 3A). In the quantum dot active layer 3, the GaInNAs upper barrier layer 34 contacts the top of the InAs quantum dot 32, and the InGaAs strain relaxation layer 33 contacts the side of the InAs quantum dot 32 (see FIG. 3A).

Thereafter, a p-AlGaAs upper cladding layer 4 (e.g., with a thickness of about 1.4 μm) and a p-GaAs contact layer 5 (e.g., with a thickness of about 0.4 μm) are sequentially formed above the GaAs barrier layer 35 (see FIG. 3A).

The structure is then processed to fabricate a laser structure. More specifically, an SiO$_2$ film is deposited, and a ridge waveguide pattern is formed on the SiO$_2$ film by photolithography, for example.

The pattern is transferred to the GaAs contact layer 5 and the AlGaAs upper cladding layer 4 by dry etching using, as a mask, the SiO$_2$ film with the ridge waveguide pattern (i.e., a part of the GaAs contact layer 5 and the AlGaAs upper cladding layer 4, which is not covered by the SiO$_2$ mask, is removed) formed therein so as to expose the AlGaAs upper cladding layer 4. In this manner, a ridge structure 6 including the GaAs contact layer 5 and the AlGaAs upper cladding layer 4, is formed (see FIG. 3A).

Such a formation of the ridge structure 6 by removing the AlGaAs upper cladding layer 4 to some midpoint thereof in this example is not limiting. The ridge structure may be formed by removing the AlGaAs upper cladding layer 4 to the top of the active layer 3 (removing the entire AlGaAs upper cladding layer 4), so as to expose the active layer 3.

The SiO$_2$ mask (SiO$_2$ film for patterning the waveguide) is then removed, and an SiO$_2$ passivation film 7 is formed so as to cover the sides of the ridge structure 6 and the surface of the AlGaAs upper cladding layer 4 (see FIG. 3A). Thereafter, current injecting electrodes 8 and 9 are formed to the top and bottom of the structure, respectively (see FIG. 3A). A highly reflective film may also be applied on facets (end faces) of the device after performing the cleavage to an array.

As described above, the semiconductor light-emitting device and the method for manufacturing the same according to this embodiment are advantageous in that the carrier injection efficiency into the quantum dot 32 can be enhanced, as well as improved quality of the quantum dot 32 achieved by relaxing the strain of the quantum dot 32. This can facilitate formation of multilayered quantum dots 32.

The GaAs barrier layer 35 provided on the top of the GaInNAs upper barrier layer 34 in the above-described embodiment is not essential, as long as at least a part of the upper barrier layer 34 contacting the top of the quantum dot 32 has a band gap larger than the band gap of the quantum dot 32 and smaller than the band gap of the lower barrier layer 31 (see FIG. 3B).

For example, only the GaInNAs upper barrier layer 34 may be provided (see FIG. 1A). The similar effects are obtained in such a case. In this case, the quality of the quantum dot 32 can be improved by the thickness of the GaInNAs upper barrier layer 34 to have a thickness capable of relaxing the strain of the quantum dot 32.

In addition, the composition of the GaInNAs upper barrier layer 34 may not be uniform, for example. That is, the composition may be varied such that the band gap of the GaInNAs upper barrier layer 34 is minimized in the part of the GaInNAs upper barrier layer 34 contacting the tops of the InAs quantum dot 32. In such a case, the profile of the band gap due to the varied composition may be continuous (e.g., linear), or may be step-wise.

Furthermore, GaInNAs lattice-matched to the GaAs substrate 1 is used for the GaInNAs upper barrier layer 34 in the above-described embodiment, the GaInNAs upper barrier layer 34 is not limiting to this. For example, GaInNAs having a lattice constant smaller than that of the GaAs substrate 1 may be used. In this case, the upper barrier layer 34 has the same effect as that of the above-described embodiment, in that the band gap of the upper barrier layer 34 is larger than that of the InAs quantum dot 32 and smaller than that of GaAs, thereby lowering the energy barrier with respect to the InAs quantum dot 32. The band gap of the upper barrier layer 34 becomes smaller than that of the lower barrier layer 31 in this case, as in the above-described embodiment.

In this manner, GaInNAs having a lattice constant smaller than that of the GaAs substrate 1 provides a tensile strain in the GaInNAs upper barrier layer 34. This can help to reduce the thickness of the GaInNAs upper barrier layer 34 (and to further reduce the thickness of the GaAs barrier layer 35).

GaInNAs is used for the upper barrier layer 34 in the above-described embodiment, the upper barrier layer 34 is not limiting to this. For example, GaNAs having a lattice constant smaller than that of the GaAs substrate 1 may be used. In this case, the upper barrier layer 34 has the same effect as that of the above-described embodiment in that the band gap of the upper barrier layer 34 becomes larger than that of the InAs quantum dot 32 and smaller than that of GaAs. The band gap of the upper barrier layer 34 becomes smaller than that of the lower barrier layer 31 in this case as in the above-described embodiment.

Furthermore, an undoped quantum dot active layer is used for the quantum dot active layer 3 in the above-described embodiment, the quantum dot active layer 3 is not limiting to this. One of the upper barrier layer, the quantum dot (including the wetting layer), the lower barrier layer, and the strain relaxation layer defining the quantum dot active layer may be formed as a p-type quantum dot active layer doped with p-type impurities. For example, the GaInNAs upper barrier layer 34 may be a p-type impurity doped layer (e.g., with a p-type concentration of $5 \times 10^{17}$ cm$^{-3}$). This provides the effect of improving the temperature characteristics of the laser, as well as the effect of lowering the energy barrier with respect to the InAs quantum dot 32.

The formation of the InAs quantum dot 32 in the above-described embodiment is not limiting. For example, an InAsSb quantum dot that can be formed above a GaAs substrate may be formed.

Furthermore, although the upper cladding layer 4 and the lower cladding layer 2 are formed from AlGaAs in the above-described embodiment, this is not limiting. For example, the upper cladding layer 4 and the lower cladding layer 2 may be formed from InGaP.

In addition, the formation of the ridge structure 6 by etching the upper cladding layer 4 (structure without etching the active layer 3) in the above-described embodiment is not limiting. For example, the lower cladding layer 2 may be etched to a midpoint thereof to form a ridge structure (high mesa structure; structure wherein the active layer is etched).

Furthermore, the above-described embodiment has been described in the context to a ridge waveguide-type semiconductor light-emitting device, this is not limiting. For example, the present invention can be applied to a buried semiconductor light-emitting device having a striped mesa structure (stripe structure) and including a buried structure, such as a p-n buried structure or a high-resistance buried structure.

In addition, the above-described embodiment has been described as formed on an n-type conductive substrate 1, this is not limiting. For example, a structure formed on a p-type conductive substrate or a highly resistive substrate may be used.

Furthermore, the MBE technique is used as a technique to grow a semiconductor layer in the above-described embodiment, this is not limiting. For example, metal organic vapor phase epitaxy (MOVPE) technique may be used.

In addition, although topmost portion of the quantum dot 32 is reevaporated with the flashing technique in the above-described embodiment, no flashing may be performed. In such a case, however, the uniformity of the quantum dot 32 may be reduced.

[Second Embodiment]

Next, a semiconductor light-emitting device and a method for manufacturing the same according to a second embodiment will be described with reference to FIG. 4.

The semiconductor light-emitting device according to this embodiment is different from the above-described first embodiment and variants thereof in that the active layer 3 has a multilayered structure having a plurality of quantum dots 32 stacked together.

That is, in this embodiment, the active layer (quantum dot active layer) 3 has a structure wherein the unit of an i-GaAs lower barrier layer 31, an i-InAs quantum dot (including a wetting layer) 32, an i-InGaAs strain relaxation layer 33 (e.g., an $In_{0.2}Ga_{0.8}As$ strain relaxation layer), and an i-GaInNAs upper barrier layer 34 are repetitively stacked (including ten quantum dots 32, in this embodiment), as depicted in FIG. 4. The same elements in FIG. 4 as in the above-described first embodiment (see FIGS. 3A and 3B, for example) are referenced by the like reference symbols.

The reasons why such a multilayered structure of the quantum dot 32 is possible are that, as described with regard to the above-described first embodiment, GaInNAs lattice-matched to the GaAs substrate 1 is used for the upper barrier layer 34, and that the thicknesses of barrier layers formed on one of the InAs quantum dots 32 in the stack structure (the total thickness of the GaInNAs upper barrier layer 34 included in the lower quantum dot layer 30 and the GaAs lower barrier layer 31 included in an upper quantum dot layer 30, in this embodiment) is configured to have a thickness capable of relaxing the strains in these layers generated by the strain of one of the quantum dots 32, thereby preventing the strain energy from being accumulated.

The description of other elements is omitted since they are the same as those in the above-described first embodiment and variants thereof.

Next, a method for manufacturing a semiconductor light-emitting device according to this embodiment will be described with reference to FIG. 4.

In the method for manufacturing a semiconductor light-emitting device, after forming an upper barrier layer 34, and prior to formation of an upper cladding layer 4, the steps of forming a lower barrier layer 31, forming a quantum dot 32, forming a strain relaxation layer 33, and forming an upper barrier layer 34 are repeated at least once (see FIG. 4).

Hereinafter, this method for manufacturing a semiconductor light-emitting device will be described in more detail.

For the growth of the respective semiconductor layers, molecular beam epitaxy (MBE) is employed, as in the above-described first embodiment.

An n-AlGaAs lower cladding layer 2 (e.g., with a thickness of about 1.4 μm), and an i-GaAs lower barrier layer 31 (e.g., with a thickness of about 33 nm) are formed on an n-GaAs substrate 1 (see FIG. 4).

Then, as in the above-described first embodiment, after forming an InAs quantum dot 32 on the GaAs lower barrier layer 31, an i-InGaAs strain relaxation layer 33 (e.g., an $In_{0.2}Ga_{0.8}As$ strain relaxation layer) is formed so as to cover the side of the InAs quantum dot 32 (see FIG. 4). Thereafter, the temperature in the growth chamber is raised, and the topmost portion of the InAs quantum dot 32 is reevaporated by flashing technique, so that the InAs quantum dot 32 has a height comparable to the thickness of the i-InGaAs strain relaxation layer 33 to make an InAs quantum dot 32 having a uniform size. An i-GaInNAs upper barrier layer 34 is formed overlying the InAs quantum dot 32 and the InGaAs strain relaxation layer 33 (see FIG. 4).

In this manner, the first quantum dot layer 30, including the GaAs lower barrier layer 31, the InAs quantum dot 32, the InGaAs strain relaxation layer 33, and the GaInNAs upper barrier layer 34, is formed on the AlGaAs lower cladding layer 2 (see FIG. 4).

Thereafter, the above-described steps of forming a GaAs lower barrier layer 31, forming an InAs quantum dot 32, forming an InGaAs strain relaxation layer 33, and forming a GaInNAs upper barrier layer 34 are repeated nine times for example, to form an active layer 3 having a multilayered stack structure of ten layers (see FIG. 4).

Then, after forming an i-GaAs barrier layer 35 on an i-GaInNAs upper barrier layer 34, which is the topmost layer of the tenth quantum dot layer 30, a p-AlGaAs upper cladding layer 4 and a p-GaAs contact layer 5 are sequentially formed, as in the above-described first embodiment (see FIG. 4). In addition, a ridge structure 6, an $SiO_2$ passivation film 7, upper and lower electrodes 8 and 9, and optionally a highly reflective film (not illustrated), are formed, as in the above-described first embodiment (see FIG. 4). Here, although ten lower barrier layers 31 and the barrier layer 35 are made from the same material, for example, these layers may be made from materials different from each other.

The description of other details is omitted since they are the same as those in the above-described first embodiment and variants thereof.

As described above, the semiconductor light-emitting device and the method for manufacturing the same according to this embodiment are advantageous in that the carrier injection efficiency into the quantum dot 32 can be enhanced, as well as improved quality of the quantum dot 32 achieved by relaxing the strain of the quantum dot 32.

Furthermore, the semiconductor light-emitting device and the method for manufacturing the same are advantageous in that the mode gain of the quantum dot active layer 3 is increased by forming the active layer 3 as multilayered structure wherein the quantum dots 32 are stacked. This can help to realize devices that can be applied to applications requiring a higher mode gain, such as high-speed direct modulation lasers, for example. For example, application of a multilayered structure as described above can enable high-speed direct modulation operations in a quantum dot laser.

Ten quantum dot layers are stacked in this embodiment, the number of stacked layers is not limiting to this. The number of stacked layers may be modified according to the application of semiconductor light-emitting devices. For example, for operating a quantum dot laser with a higher-speed direct modulation of about 10 Gb/s, which requires a mode gain of about 40 $cm^{-1}$ or greater, stacking around ten or more quantum dot layers may be required. Techniques as described in Japanese Laid-Open Patent Application No. 2000-196065 or Japanese Translation of PCT International Application No. 2005-534164 cannot achieve a greater mode gain since stack of multiple quantum dot layers is difficult.

[Third Embodiment]

Next, a semiconductor light-emitting device and a method for manufacturing the same according to a third embodiment will be described with reference to FIG. 5.

Figure 5:
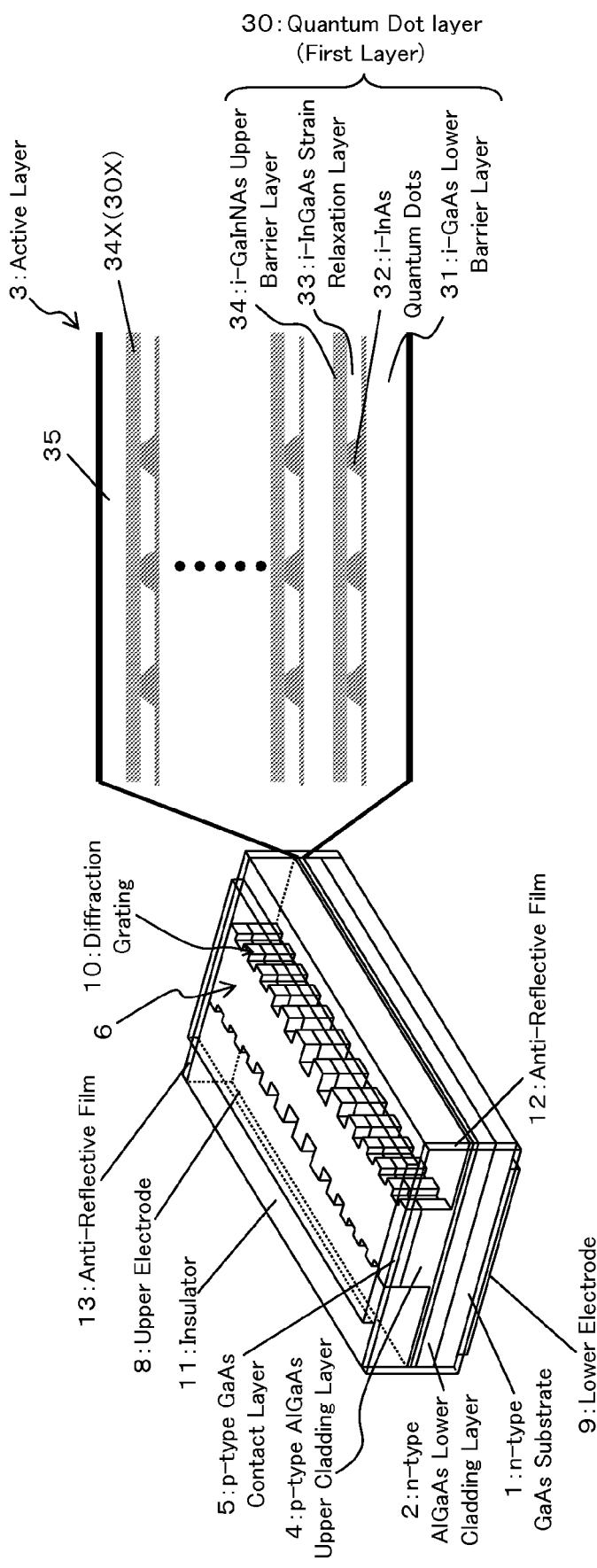
FIG. 5 is a schematic view illustrating an exemplary configuration of a semiconductor light-emitting device according to a third embodiment.

The semiconductor light-emitting device according to this embodiment is different from the above-described second embodiment and variants thereof (see FIG. 4) in that diffraction gratings 10 are formed in the side walls of the ridge structure 6, as depicted in FIG. 5.

More specifically, as depicted in FIG. 5, this semiconductor light-emitting device is a vertical diffraction grating DFB laser (distributed feedback semiconductor laser; index-coupled DFB laser using quantum dot) having the same layered structure as that in the above-described second embodiment (see FIG. 4), and having the diffraction gratings 10 provided vertically to the side walls of the ridge structure 6. The same elements in FIG. 5 as those in the above-described second embodiment (see FIG. 4) are referenced by the like reference symbols. Furthermore, in this embodiment, the ridge structure 6 is buried with an insulator 11, such as a UV cure resin, for example, as depicted in FIG. 5. On facets of the device, anti-reflective films 12 and 13 are provided.

The description of other elements is omitted since they are the same as those in the above-described second embodiment and variants thereof.

Next, a semiconductor light-emitting device and a method for manufacturing the same according to this embodiment will be described with reference to FIG. 5.

The manufacturing steps before forming the ridge structure 6 are the same as those in the above-described second embodiment.

The step of forming the ridge structure 6 involves depositing an $SiO_2$ film, followed by formation of a ridge waveguide pattern and a diffraction grating pattern on the $SiO_2$ film using electron beam (EB) exposure, for example.

The pattern is transferred to the p-GaAs contact layer 5 and the p-AlGaAs upper cladding layer 4 by dry etching using, as a mask, the $SiO_2$ film with the ridge waveguide and diffraction grating patterns formed therein (i.e., a part of the GaAs contact layer 5 and the AlGaAs upper cladding layer 4, which is not covered by the $SiO_2$ mask, is removed) so as to expose the AlGaAs upper cladding layer 4. In this manner, the ridge structure 6 is formed, which includes the GaAs contact layer 5 and the AlGaAs upper cladding layer 4, and has the diffraction gratings 10 in the side walls.

The ridge structure 6 is formed by removing the AlGaAs upper cladding layer 4 to some midpoint thereof in this example, a formation of the ridge structure 6 is not limiting to this. The ridge structure may be formed by removing the AlGaAs upper cladding layer 4 to the top of the active layer 3 (removing the entire AlGaAs upper cladding layer 4), so as to expose the active layer 3.

The $SiO_2$ mask ($SiO_2$ film for patterning the waveguide) is then removed, and the ridge structure 6 is buried with an insulator 11, such as a UV cure resin, for example. Thereafter, as in the above-described second embodiment, current injecting electrodes 8 and 9 are formed on the top and bottom of the structure, respectively. Optionally, anti-reflective films or highly reflective films may be provided on facets of the device (anti-reflective films 12 and 13 are provided on the facets in this embodiment).

The description of other details are omitted since they are the same as those in the above-described second embodiment and variants thereof.

As described above, as in the above-described second embodiment, the semiconductor light-emitting device and the method for manufacturing the same according to this embodiment are advantageous in that the carrier injection efficiency into the quantum dot 32 can be enhanced, as well as improved quality of the quantum dot 32 achieved by relaxing the strain of the quantum dot 32.

Furthermore, the semiconductor light-emitting device and the method for manufacturing the same are advantageous in that the mode gain of the quantum dot active layer 3 is increased by forming the active layer 3 as multilayered structure wherein the quantum dots 32 are stacked. This can help to realize devices that can be applied to applications requiring a higher mode gain, such as high-speed direct modulation lasers, for example. For example, application of a multilayered structure as described above can enable high-speed direct modulation operations in a quantum dot laser.

[Fourth Embodiment]

Next, a semiconductor light-emitting device and a method for manufacturing the same according to a fourth embodiment will be described with reference to FIG. 6.

The semiconductor light-emitting device according to this embodiment is a surface emitting laser (vertical cavity surface emitting laser (VCSEL)) having an active layer 3 with the same layered structure as that of the above-described second embodiment and variants thereof.

Figure 6:
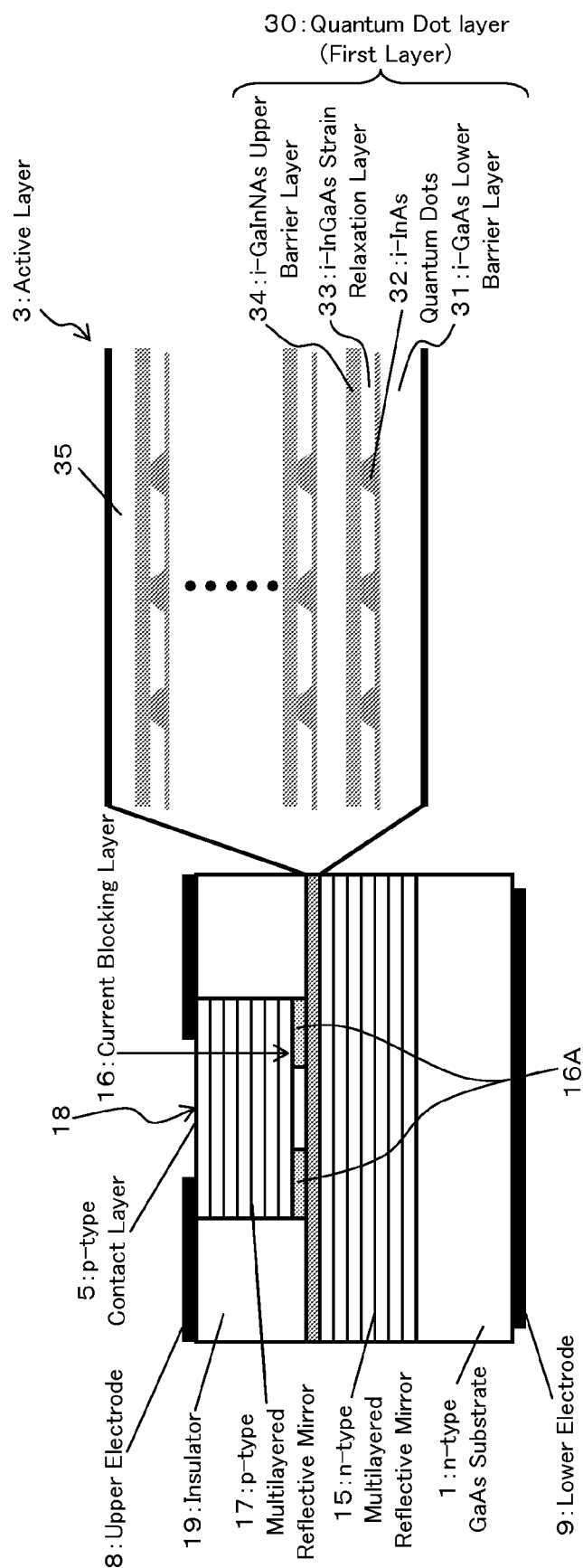
FIG. 6 is a schematic cross-sectional view illustrating an exemplary configuration of a semiconductor light-emitting device according to a fourth embodiment.

As depicted in FIG. 6, this surface emitting laser has a structure wherein a lower semiconductor multilayered reflective mirror 15 (n-type GaAs/AlAs multilayered reflective mirror in this embodiment); an active layer (quantum dot active layer) 3 having the same layered structure as that of the above-described second embodiment and variants thereof; a current blocking layer 16 (p-type AlAs current blocking layer having a current blocking section made of AlAs oxide film ($Al_xO_y$) obtained by oxidizing an AlAs layer); a upper semiconductor multilayered reflective mirror 17 (p-type GaAs/AlGaAs multilayered reflective mirror in this embodiment); and a p-type contact layer 5 (p-type GaAs contact layer in this embodiment) are stacked on an n-type GaAs substrate 1, in this order, viewed from the substrate 1 side. The same elements in FIG. 6 as those in the above-described second embodiment (see FIG. 4) are referenced by the like reference symbols.

Additionally, a mesa structure 18 is provided formed by etching the structure to the top of the active layer 3.

The mesa structure 18, including a p-type AlAs current blocking layer 16, a p-type GaAs/AlGaAs multilayered reflective mirror 17, and a p-type GaAs contact layer 5, is buried with an insulator 19, such as a UV cure resin, for example.

An upper electrode (p-side electrode) 8 is formed on the p-type GaAs contact layer 5, and a lower electrode (n-side electrode) 9 is formed on the back side of the n-type GaAs substrate 1.

In this embodiment, the active layer 3 is configured in the manner similar to the above-described second embodiment and variants thereof.

Additionally, an n-type GaAs/AlAs multilayered reflective mirror 15 and a p-type GaAs/AlGaAs multilayered reflective mirror 17 are provided above and below the active layer 3, sandwiching the active layer 3, to form a resonator structure.

Next, a method for manufacturing a semiconductor light-emitting device (surface emitting laser) according to this embodiment will be described with reference to FIG. 6.

For the growth of the respective semiconductor layers, molecular beam epitaxy (MBE) is employed, similar to the case of the above-described second embodiment.

Initially, an n-type GaAs/AlAs multilayered reflective mirror 15 is formed on an n-GaAs substrate 1 (see FIG. 6).

Thereafter, on the n-GaAs/AlAs multilayered reflective mirror 15, an active layer (quantum dot active layer) 3 is formed (see FIG. 6), as in the above-described second embodiment.

More specifically, an i-GaAs lower barrier layer 31 is formed on the GaAs/AlAs multilayered reflective mirror 15 (see FIG. 6).

After forming an InAs quantum dot 32 on the GaAs lower barrier layer 31, an i-InGaAs strain relaxation layer 33 is formed so as to cover the side of the InAs quantum dot 32 (see FIG. 6). Thereafter, the temperature in the growth chamber is raised, and the topmost portion of the InAs quantum dot 32 is reevaporated by flashing technique, so that the InAs quantum dot 32 has a height comparable to the thickness of the i-InGaAs strain relaxation layer 33 to make an InAs quantum dot 32 having a uniform size. An i-GaInNAs upper barrier layer 34 is formed overlying the InAs quantum dot 32 and the InGaAs strain relaxation layer 33 (see FIG. 6).

In this manner, the first quantum dot layer 30, including the GaAs lower barrier layer 31, the InAs quantum dot 32, the InGaAs strain relaxation layer 33, and the GaInNAs upper barrier layer 34, is formed on the GaAs/AlAs multilayered reflective mirror 15 (see FIG. 6).

Thereafter, the above-described steps of forming a GaAs lower barrier layer 31, forming an InAs quantum dot 32, forming an InGaAs strain relaxation layer 33, and forming a GaInNAs upper barrier layer 34 are repeated nine times for example, to form an active layer 3 having a multilayered stack structure of ten layers (see FIG. 6).

Then, an i-GaAs barrier layer 35 is formed on an i-GaInNAs upper barrier layer 34, which is the topmost layer of the tenth quantum dot layer 30.

Upon forming the active layer 3 in this manner, preferably, the thickness of the topmost GaAs layer 35 or the bottommost GaAs layer 31 included in the active layer 3 is adjusted, or another AlGaAs layer is provided above or below the active layer 3, such that the anti-node of stationary wave is located with the center of the active layer 3.

Thereafter, a p-AlAs current blocking layer 16, a p-GaAs/AlGaAs multilayered reflective mirror 17, and a p-GaAs contact layer 5 are sequentially stacked above the active layer 3. For reducing the resistance, a p-GaAs/$Al_{0.9}Ga_{0.1}$As multilayered reflective mirror is preferably used as the p-GaAs/AlGaAs multilayered reflective mirror 17, for example. A p-type GaAs/AlAs multilayered reflective mirror may also be used as the upper semiconductor multilayered reflective mirror 17, without taking the resistance into consideration.

Thereafter, layers from the GaAs contact layer 5 to the AlAs current blocking layer 16 are removed using conventional photolithography and etching so as to expose the surface of the active layer 3, thereby forming a mesa structure 18.

Thereafter, a current blocking structure is formed in AlAs current blocking layer 16. In this example, AlAs is oxidized by means of the natural oxidation, for example, so as to form the p-type AlAs current blocking layer 16 having current blocking sections 16A made of AlAs oxide film ($Al_xO_y$) in the vicinity of the sides of the mesa structure 18.

After burying the mesa structure 18 with an insulator 19, such as a UV cure resin, for example, current injecting electrodes 8 and 9 are formed on the top and bottom of the device, respectively, to obtain a surface emitting laser structure.

The description of other details are omitted since they are the same as those in the above-described second embodiment and variants thereof.

As described above, as in the above-described second embodiment, the semiconductor light-emitting device and the method for manufacturing the same according to this embodiment are advantageous in that the carrier injection efficiency into the quantum dot 32 can be enhanced, as well as improved quality of the quantum dot 32 achieved by relaxing the strain of the quantum dot 32.

Furthermore, the semiconductor light-emitting device and the method for manufacturing the same are advantageous in that the mode gain of the quantum dot active layer 3 is increased by forming the active layer 3 as multilayered structure wherein the quantum dots 32 are stacked. This can help to realize devices that can be applied to applications requiring a higher mode gain, such as high-speed direct modulation lasers, for example. For example, application of a multilayered structure as described above can enable high-speed direct modulation operations in a quantum dot laser.

Note that the above-described embodiment has been described in the context to a surface emitting laser having a current blocking structure in which an oxide film is used, this is not limiting. The present invention can be applied to surface emitting lasers having different structures.

[Fifth Embodiment]

Now, a semiconductor light-emitting device according to a fifth embodiment and a method for manufacturing the same will be described with reference to FIGS. 7A and 7B.

Figure 7A:
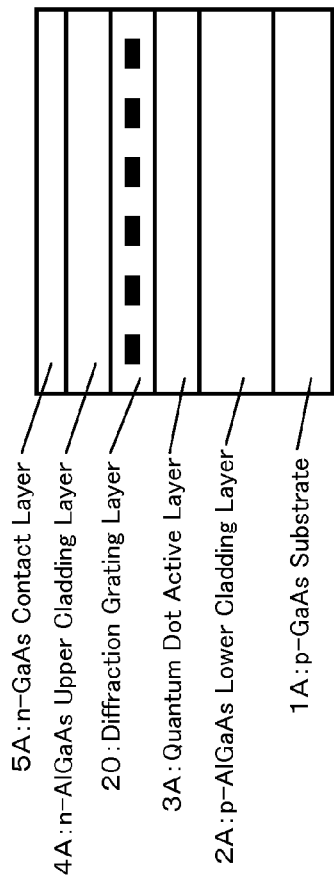
FIG. 7A is a schematic view illustrating an exemplary configuration of a semiconductor light-emitting device according to a fifth embodiment, and is a cross-sectional view along the light propagation direction.
Figure 7B:
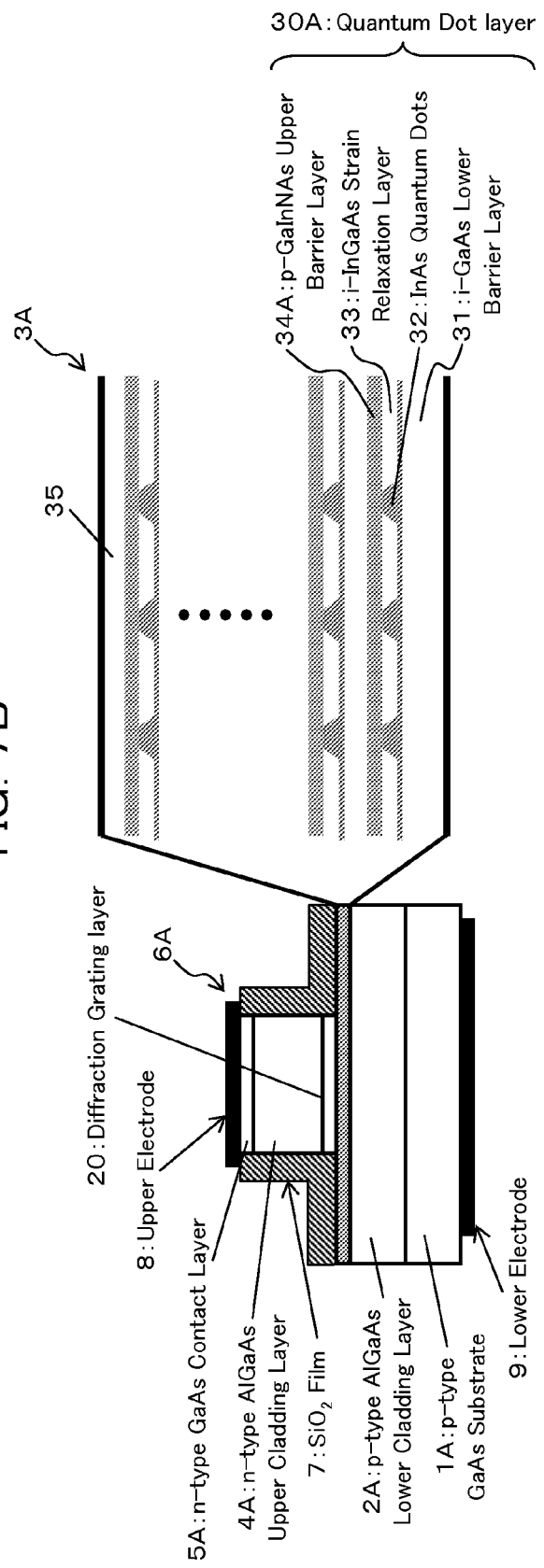
FIG. 7B is a schematic view illustrating an exemplary configuration of a semiconductor light-emitting device according to a fifth embodiment, and is a cross-sectional view along the direction perpendicular to the light propagation direction.

A semiconductor light-emitting device according to this embodiment is different from the above-described second embodiment and variants thereof in that a diffraction grating layer 20 is formed in a layered structure, as depicted in FIGS. 7A and 7B. Furthermore, this embodiment is different in that it is formed above a p-type GaAs substrate 1A and that the active layer 3A has a p-doped GaInNAs upper barrier layer 34A.

More specifically, this semiconductor light-emitting device is an index-coupled quantum dot semiconductor light-emitting device (index-coupled DFB laser using quantum dot in this embodiment) including a diffraction grating 20 in a semiconductor stack structure. As depicted in FIGS. 7A and 7B, the semiconductor light-emitting device has a structure wherein a p-type AlGaAs lower cladding layer 2A, an active layer (quantum dot active layer) 3A, a diffraction grating layer 20 (e.g., n-type GaAs guide layer including an n-type InGaP diffraction grating), an n-type AlGaAs upper cladding layer 4A, and an n-type GaAs contact layer 5A are stacked on a p-type GaAs substrate 1A (p-type conductive substrate). The active layer 3A has the same layered structure as that of the above-described second embodiment and variants thereof, except that a p-type GaInNAs upper barrier layer 34A is used. The same elements in FIGS. 7A and 7B as those in the above-described second embodiment (see FIG. 4) are referenced by the like reference symbols.

This quantum dot semiconductor light-emitting device is configured as the ridge waveguide-type quantum dot semiconductor light-emitting device (ridge waveguide-type quantum dot DFB laser) having a ridge structure 6A (stripe structure; striped mesa structure) including the n-type GaAs contact layer 5A, the n-type AlGaAs upper cladding layer 4A, and the diffraction grating layer 20, as depicted in FIG. 7B.

In addition, the upper surface of the active layer 3A is exposed on opposite sides of the ridge structure 6A. In other words, the active layer 3A extends to the side faces of the p-type GaAs substrate 1A.

Forming the ridge structure 6A so as to expose the active layer 3A is advantageous in that the coupling constant of the transverse mode (fundamental mode) to the diffraction grating is increased, thereby suppressing higher-order transverse modes.

In this embodiment, the active layer 3A is an InAs quantum dot active layer partially including p-type impurities and having an emission wavelength of about 1.3 μm. More specifically, as depicted in FIG. 7B, the active layer 3A has a stack structure wherein a unit of an i-GaAs lower barrier layer 31 (barrier layer), an InAs quantum dot 32 (including a wetting layer), an i-InGaAs strain relaxation layer 33 (side barrier layer) formed so as to cover the side of the InAs quantum dot 32, and a GaInNAs upper barrier layer 34 (barrier layer; p-type doped layer) partially doped with p-type impurities is repeated multiple times (ten times in this embodiment). Note that the number of stacked layers in the active layer 3A is not limited to ten, and the number of stacked layers may be modified according to the application of the semiconductor light-emitting device, for example.

Note that the configuration of the active layer 3A is not limited to the one described above. Although the active layer 3A is configured to include the GaInNAs upper barrier layer 34A partially doped with p-type impurities in this embodiment, this is not limiting. For example, at least one of the quantum dot (including the wetting layer), the lower barrier layer, and the strain relaxation layer, included in the active layer 3A, may be configured as a quantum dot active layer doped with p-type impurities (configured as a p-type quantum dot active layer), or may be configured as an undoped quantum dot active layer without no p-type impurities doped therein, as in the above-described second embodiment and variants thereof.

As described above in this embodiment, the active layer 3A is configured as a p-type quantum dot active layer, and the lower cladding layer 2A formed below the active layer 3A is made from p-type AlGaAs and the upper cladding layer 4A included in the ridge structure 6A is made from n-type AlGaAs. This enables formation of the ridge structure (ridge waveguide) 6A having a reduced area of the p-n hetero junction, which achieves a ridge waveguide-type quantum dot semiconductor light-emitting device with a smaller capacitance.

As depicted in FIGS. 7A and 7B, an insulating layer ($SiO_2$ film) 7 made from $SiO_2$ and an upper electrode (n-side electrode) 8 are also formed on the surface of the device, and a lower electrode (p-side electrode) 9 is formed on the back side of the device.

The cavity structure of the device has a variety of structures depending on the design, including a structure provided with a highly reflective coating and an anti-reflective coating on facets (the front and rear end faces), respectively, for example.

The description of other elements is omitted since they are the same as those in the above-described second embodiment and variants thereof.

Now, a method for manufacturing a semiconductor light emitting device according to this embodiment will be described with reference to FIGS. 7A and 7B.

For the growth of the respective semiconductor layers, molecular beam epitaxy (MBE) is employed, similar to the case of the above-described second embodiment.

Initially, a p-AlGaAs lower cladding layer 2A is formed on a p-GaAs substrate 1A (p-type conductive substrate).

Thereafter, an active layer (quantum dot active layer) 3A is formed in the manner similar to the above-described second embodiment and variants thereof, except that a GaInNAs upper barrier layer 34A partially doped with p-type impurities is formed on the AlGaAs lower cladding layer 2A.

More specifically, on the AlGaAs lower cladding layer 2A, an InAs quantum dot active layer 3A having an emission wavelength of about 1.3 μm is sequentially formed. The InAs quantum dot active layer 3A is formed by repetitively (e.g., ten times) stacking a unit of an i-GaAs lower barrier layer 31, an InAs quantum dot 32 (including a wetting layer), an i-In- GaAs strain relaxation layer 33, and a GaInNAs upper barrier layer 34A partially doped with p-type impurities (see FIG. 7B).

Thereafter, a diffraction grating layer 20 is formed on the active layer 3A. For example, as a diffraction grating layer 20, a diffraction grating layer, which has a fine-stripe InGaP diffraction grating that is made from InGaP lattice-matched to GaAs, is formed inside the GaAs guide layer along the light propagation direction.

An n-AlGaAs upper cladding layer 4A and an n-GaAs contact layer 5A are then sequentially stacked on the diffraction grating layer 20.

Thereafter, an $SiO_2$ film is deposited, and a ridge waveguide pattern is formed on the $SiO_2$ film by photolithography, for example.

The ridge waveguide pattern is transferred to the GaAs contact layer 5A, the AlGaAs upper cladding layer 4A, and the diffraction grating layer 20 by a chlorine-based dry etching using, as a mask, the $SiO_2$ film having the ridge waveguide pattern formed therein (i.e., parts of the GaAs contact layer 5A, the AlGaAs upper cladding layer 4A, and the diffraction grating layer 20, which are not covered by the $SiO_2$ mask, are removed) so as to expose the active layer 3A. In this manner, a ridge structure 6A including the GaAs contact layer 5A, the AlGaAs upper cladding layer 4A, and the diffraction grating layer 20, is formed.

The $SiO_2$ mask is then removed, and an $SiO_2$ passivation layer ($SiO_2$ film) is deposited so as to cover the ridge structure 6A. Thereafter, current injecting electrodes 8 and 9 are formed on the top and bottom of the structure, respectively. Furthermore, facet coating may also be applied after performing the cleavage to an array. For example, an anti-reflective coating and a highly reflective coating may be applied on facets (the front and rear end faces), respectively.

The description of other details are omitted since they are the same as those in the above-described second embodiment and variants thereof.

As described above, as in the above-described second embodiment, the semiconductor light-emitting device and the method for manufacturing the same according to this embodiment are advantageous in that the carrier injection efficiency into the quantum dot 32 can be enhanced, as well as improved quality of the quantum dot 32 achieved by relaxing the strain of the quantum dot 32.

Furthermore, the semiconductor light-emitting device and the method for manufacturing the same are advantageous in that the mode gain of the quantum dot active layer 3A is increased by forming the active layer 3A as multilayered structure wherein the quantum dots 32 are stacked. This can help to realize devices that can be applied to applications requiring a higher mode gain, such as high-speed direct modulation lasers, for example. For example, application of a multilayered structure as described above can enable high-speed direct modulation operations in a quantum dot laser.

Although the diffraction grating layer 20 is provided above the active layer 3A, i.e., between the active layer 3A and the upper cladding layer 4A in the above-described embodiment, any other structures may be used which has a diffraction grating layer in any locations in the layered structure. For example, the diffraction grating layer may be provided below the active layer 3A, i.e., between the active layer 3A and the lower cladding layer 2A. In this manner, the present invention is applicable to laser structures fabricated by repeating crystal growths, including a burying growth for forming a diffraction grating.

In addition, although the ridge bottom is defined from the diffraction grating layer 20 and the active layer 3A is exposed on opposite sides of the ridge structure 6A in the above-described embodiment (see FIG. 7B), this is not limiting. For example, the ridge bottom may be defined in some midpoint of the diffraction grating layer so that the diffraction grating layer (light guide layer) is exposed on opposite sides of the ridge structure. It should be noted that the diffraction grating is present outside of the ridge structure in this case, and, therefore, attentions may be paid for the presence of higher-order transverse modes, since the higher-order transverse modes more easily couple.

Furthermore, in the above-described embodiment, the diffraction grating included in the diffraction grating layer 20 may be configured as a diffraction grating with a λ/4 wavelength shift.

In addition, the above-described embodiment has been described in the context to a distributed deed-back (DFB) laser having a diffraction grating, this is not limiting and the above-described embodiment may be configured as a distributed Bragg reflector (DBR) laser provided with a diffraction grating.

Furthermore, the above-described embodiment may be configured to have an n-type AlAs current blocking layer (or n-type AlGaAs current blocking layer) including current blocking sections (e.g., made from an AlAs oxide film ($Al_xO_y$) obtained by oxidizing an AlAs layer) in the vicinity of the sides of the ridge structure. This can help to realize a semiconductor light-emitting device (index coupled DFB laser) with a reduced threshold current, without any drop in the contact resistance.

In addition, although the above-described embodiment has been described as being formed on a p-type conductive substrate, this is not limiting. For example, a structure formed on an n-type conductive substrate or a highly resistive substrate may be used. For example, the semiconductor light-emitting device may be configured as a lateral current injection semiconductor light-emitting device (lateral current injection semiconductor laser) formed on a highly resistive substrate.

Figure 8:
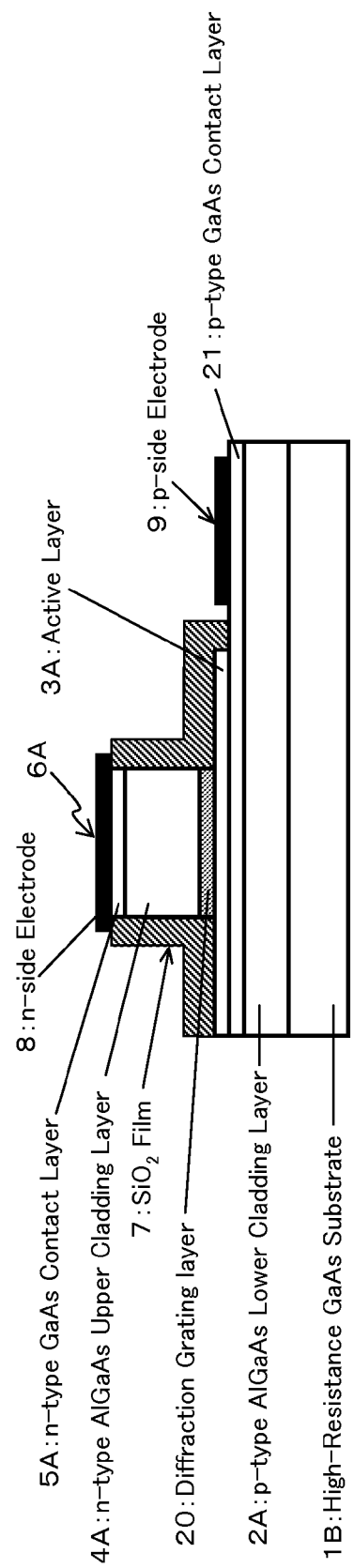
FIG. 8 is a schematic cross-sectional view illustrating an exemplary configuration of a semiconductor light-emitting device according to a variant of the fifth embodiment.

Such a lateral current injection semiconductor light-emitting device may have a structure wherein a p-AlGaAs lower cladding layer 2A, a p-GaAs contact layer 21, a quantum dot active layer 3A, a diffraction grating layer 20, an n-AlGaAs upper cladding layer 4A, and an n-GaAs contact layer 5A are sequentially stacked on a high-resistance GaAs substrate 1B, as depicted in FIG. 8, for example. This semiconductor light-emitting device also has a ridge structure 6A including a diffraction grating layer 20, an n-AlGaAs upper cladding layer 4A, and an n-GaAs contact layer 5A, wherein an insulating layer ($SiO_2$ film) 7 made from $SiO_2$, an n-side electrode 8, and a p-side electrode 9 are formed on the surface of the device. The same elements in FIG. 8 as in the above-described first embodiment (see FIGS. 7A and 7B) are referenced by the like reference symbols.

More specifically, in contrast to the configuration of the above-described embodiment (see FIGS. 7A and 7B), this semiconductor light-emitting device is constructed using a high-resistance GaAs substrate 1B, wherein the high-resistance GaAs substrate 1B and the p-AlGaAs lower cladding layer 2A are extended, the p-GaAs contact layer 21 is provided between a p-AlGaAs lower cladding layer 2A and a quantum dot active layer 3A, and the p-side electrode 9 is provided on the p-GaAs contact layer 21.

Note that this semiconductor light-emitting device is described above as a variant of fifth embodiment described above, this is not limiting and it may be configured as a variant of the above-described first or second embodiment.

[Others]

Note that the present invention is not limited to the configurations of the embodiments and variants thereof set forth above, and may be modified in various manners without departing from the spirit of the present invention.

Although the above-described embodiments and variants thereof have been described with reference to a semiconductor laser as semiconductor light-emitting device, the present invention can be applied to other semiconductor light-emitting devices, such as a semiconductor optical amplifier, for example.

Figure 9:
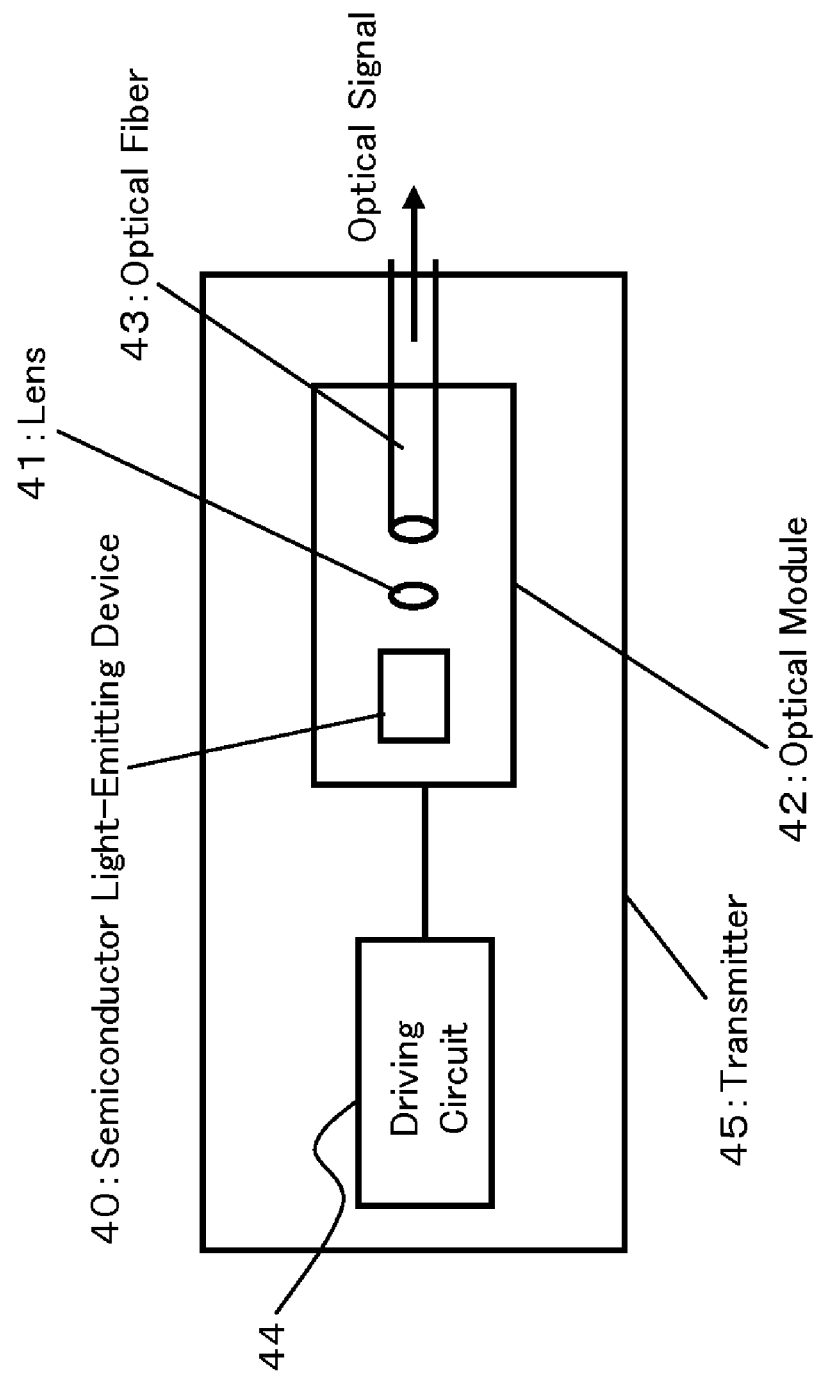
FIG. 9 is a schematic view illustrating an exemplary configuration of an optical module and a transmitter including the semiconductor light-emitting device of the embodiments.

Furthermore, for example, as depicted in FIG. 9, a semiconductor light-emitting device 40 according to the above-described embodiments and variants thereof is used in an optical module 42, together with other devices, such as a lens 41.

In order to permit light to be extracted outside through the lens 41 disposed on the optical axis, an optical fiber 43 is connected to the optical module 42, for example. Note that the optical module 42 may have the optical fiber 43 mounted therewith, or may have a connector for connecting an outside optical fiber.

In this manner, the optical module 42 including a semiconductor light-emitting device 40 having an enhanced carrier injection efficiency into the quantum dot 32 is achieved. Particularly, it is possible to realize an optical module 42 having a semiconductor light-emitting device 40 with an enhanced mode gain of the quantum dot active layer 3 or 3A. For example, it is possible to realize an optical module having a high-speed direct modulation laser, which can send optical signals modulated at a high speed with a higher injection efficiency.

An optical module 42 as configured in this manner may be used in combination with a driving circuit (electronic circuit) 44, to fabricate a transmitter 45 for optical communications, as depicted in FIG. 9, for example. Particularly, it is possible to realize a transmitter 45 having a semiconductor light-emitting device 40 with an enhanced mode gain of the quantum dot active layer 3 or 3A. For example, it is possible to realize a transmitter having a high-speed direct modulation laser, which can send signals modulated at a high speed.

Figure 10:
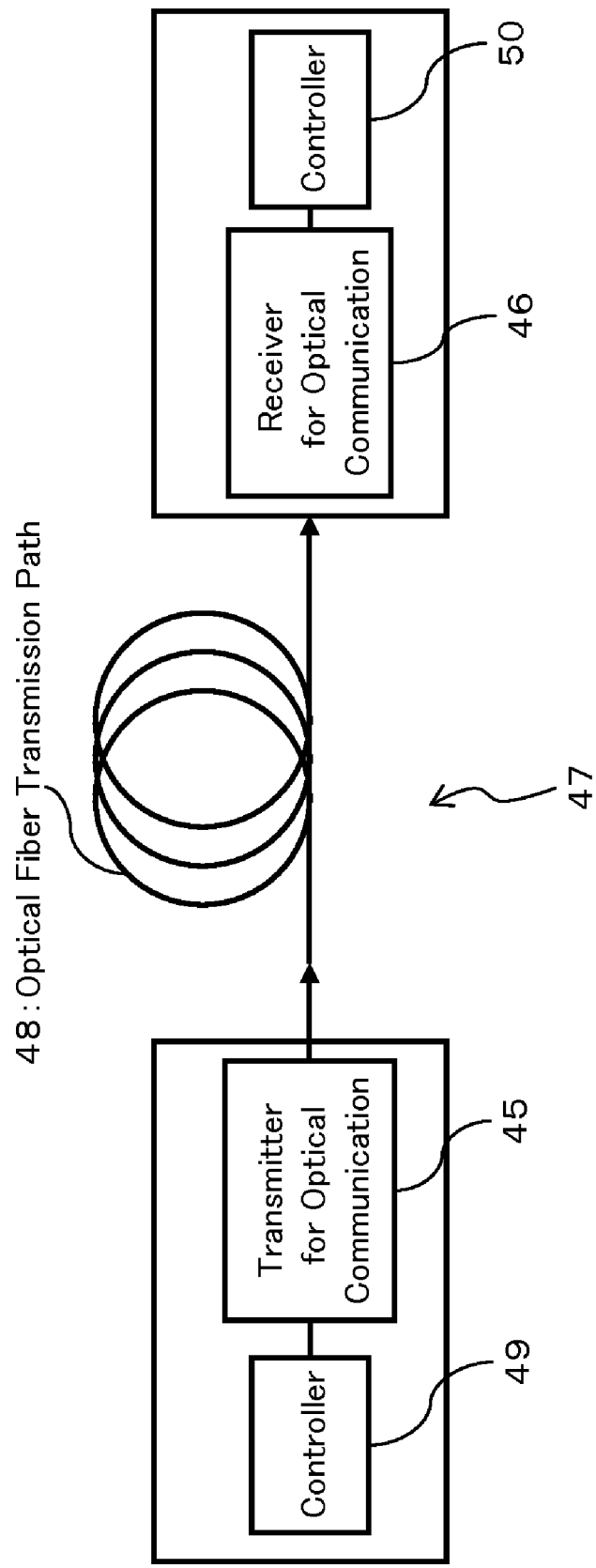
FIG. 10 is a schematic view illustrating an exemplary configuration of an optical communication system having a transmitter including the semiconductor light-emitting device of the embodiments.

A transmitter 45 as configured in this manner may be used in combination with a receiver 46 to configure an optical communication system 47, as depicted in FIG. 10. More specifically, an optical communication system 47 including a receiver 46 connected to the transmitter 45 described above via an optical transmission path 48 (e.g., optical fiber transmission path), and controllers 49 and 50 for the transmitter 45 and the receiver 46. Particularly, it is possible to realize the optical communication system 47 having a semiconductor light-emitting device 40 with an enhanced mode gain of the quantum dot active layer 3 or 3A. For example, it is possible to realize an optical communication system having a high-speed direct modulation laser, which can send and receive optical signals modulated at a high speed.

All the examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) has (have) been described in detail, it should be understood that the various changes, substitutions, and alterations could be made hereto without departing from the gist and scope of the invention.

What is claimed is:

1. A semiconductor light-emitting device comprising:
a GaAs substrate; and
an active layer provided over the GaAs substrate, the active layer comprising:
  a lower barrier layer lattice-matched to the GaAs substrate;
  a quantum dot provided on the lower barrier layer;
  a strain relaxation layer covering a side of the quantum dot; and
  an upper barrier layer contacting the top of the quantum dot, at least a portion of the upper barrier layer contacting the top of the quantum dot being lattice-matched to the GaAs substrate, and at least the portion of the upper barrier layer contacting the top of the quantum dot having a band gap larger than a band gap of the quantum dot and smaller than a band gap of GaAs.

2. A semiconductor light-emitting device comprising:
a GaAs substrate; and
an active layer provided over the GaAs substrate, the active layer comprising:
  a lower barrier layer lattice-matched to the GaAs substrate;
  a quantum dot provided on the lower barrier layer;
  a strain relaxation layer covering a side of the quantum dot; and
  an upper barrier layer contacting the top of the quantum dot, at least a portion of the upper barrier layer contacting the top of the quantum dot having a lattice constant smaller than a lattice constant of the GaAs substrate, and at least the portion of the upper barrier layer contacting the top of the quantum dot having a band gap larger than a band gap of the quantum dot and smaller than a band gap of GaAs.

3. The semiconductor light-emitting device according to claim 1, wherein the band gap of the upper barrier layer is smaller than a band gap of the lower barrier layer.

4. The semiconductor light-emitting device according to claim 1, wherein the active layer has a structure in which the lower barrier layer, the quantum dot, the strain relaxation layer, and the upper barrier layer are repetitively stacked.

5. The semiconductor light-emitting device according to claim 4, wherein a total thickness of the upper barrier layer and the lower barrier layer provided on the quantum dot in the stack structure is a thickness being capable of relaxing a strain caused by a strain of the quantum dot.

6. The semiconductor light-emitting device according to claim 1, wherein the portion of the upper barrier layer contacting the top of the quantum dot is GaInNAs.

7. The semiconductor light-emitting device according to claim 2, wherein the portion of the upper barrier layer contacting the top of the quantum dot is GaNAs.

8. The semiconductor light-emitting device according to claim 1, wherein the lower barrier layer is a GaAs layer.

9. The semiconductor light-emitting device according to claim 1, wherein the strain relaxation layer has a lattice constant larger than a lattice constant of the GaAs substrate.

10. The semiconductor light-emitting device according to claim 1, wherein the strain relaxation layer is an InGaAs layer.

11. The semiconductor light-emitting device according to claim 1, wherein the quantum dot is an InAs quantum dot.

12. An optical module comprising:
a semiconductor light-emitting device, the semiconductor light-emitting device comprising:
- a GaAs substrate; and
- an active layer provided over the GaAs substrate, the active layer comprising:
  - a lower barrier layer lattice-matched to the GaAs substrate;
  - a quantum dot provided on the lower barrier layer;
  - a strain relaxation layer covering a side of the quantum dot; and
  - an upper barrier layer contacting the top of the quantum dot, at least a portion of the upper barrier layer contacting the top of the quantum dot being lattice-matched to the GaAs substrate, and at least the portion of the upper barrier layer contacting the top of the quantum dot having a band gap larger than a band gap of the quantum dot and smaller than a band gap of GaAs; and a lens optically coupled to the semiconductor light-emitting device.

13. A transmitter comprising:
an optical module, the optical module comprising a semiconductor light-emitting device, the semiconductor light-emitting device comprising:
- a GaAs substrate; and
- an active layer provided over the GaAs substrate, the active layer comprising:
  - a lower barrier layer lattice-matched to the GaAs substrate;
  - a quantum dot provided on the lower barrier layer;
  - a strain relaxation layer covering a side of the quantum dot; and
  - an upper barrier layer contacting the top of the quantum dot, at least a portion of the upper barrier layer contacting the top of the quantum dot being lattice-matched to the GaAs substrate, and at least the portion of the upper barrier layer contacting the top of the quantum dot having a band gap larger than a band gap of the quantum dot and smaller than a band gap of GaAs; and a driving circuit connected to the optical module.

14. An optical communication system comprising:
a transmitter comprising an optical module, the optical module comprising a semiconductor light-emitting device, the semiconductor light-emitting device comprising:
- a GaAs substrate; and
- an active layer provided over the GaAs substrate, the active layer comprising:
  - a lower barrier layer lattice-matched to the GaAs substrate;
  - a quantum dot provided on the lower barrier layer;
  - a strain relaxation layer covering a side of the quantum dot; and
  - an upper barrier layer contacting the top of the quantum dot, at least a portion of the upper barrier layer contacting the top of the quantum dot being lattice-matched to the GaAs substrate, and at least the portion of the upper barrier layer contacting the top of the quantum dot having a band gap larger than a band gap of the quantum dot and smaller than a band gap of GaAs; and a receiver connected to the transmitter via an optical transmission path.

15. The semiconductor light-emitting device according to claim 2, wherein the band gap of the upper barrier layer is smaller than a band gap of the lower barrier layer.

16. The semiconductor light-emitting device according to claim 2, wherein the active layer has a structure in which the lower barrier layer, the quantum dot, the strain relaxation layer, and the upper barrier layer are repetitively stacked.

17. The semiconductor light-emitting device according to claim 16, wherein a total thickness of the upper barrier layer and the lower barrier layer provided on the quantum dot in the stack structure is a thickness being capable of relaxing a strain caused by a strain of the quantum dot.

18. The semiconductor light-emitting device according to claim 2, wherein the portion of the upper barrier layer contacting the top of the quantum dot is GaInNAs.

19. The semiconductor light-emitting device according to claim 2, wherein the lower barrier layer is a GaAs layer.

20. The semiconductor light-emitting device according to claim 2, wherein the strain relaxation layer has a lattice constant larger than a lattice constant of the GaAs substrate.

* * * * *

UNITED STATES PATENT AND TRADEMARK OFFICE
CERTIFICATE OF CORRECTION

PATENT NO. : 8,304,757 B2  
APPLICATION NO. : 12/877624  
DATED : November 6, 2012  
INVENTOR(S) : Nobuaki Hatori et al.

Page 1 of 1

It is certified that error appears in the above-identified patent and that said Letters Patent is hereby corrected as shown below:

On the Title page:
Change

Related U.S. Application Data

(63)   Continuation of application No. PCT/JP2008/055144, filed on Mar. 19, 2008

To be

Related U.S. Application Data

(63)   Continuation of application No. PCT/JP2008/055114, filed on Mar. 19, 2008

Signed and Sealed this  
Fifth Day of February, 2013

Teresa Stanek Rea  
*Acting Director of the United States Patent and Trademark Office*